(12) United States Patent
Chen

(10) Patent No.: US 10,578,913 B2
(45) Date of Patent: Mar. 3, 2020

(54) DISPLAY APPARATUS

(71) Applicants: HKC Corporation Limited, Shenzhen (CN); Chongqing HKC Optoelectronics Technology Co., Ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 122 days.

(21) Appl. No.: 15/744,834

(22) PCT Filed: Apr. 10, 2017

(86) PCT No.: PCT/CN2017/079884
§ 371 (c)(1),
(2) Date: Jan. 15, 2018

(87) PCT Pub. No.: WO2018/166017
PCT Pub. Date: Sep. 20, 2018

(65) Prior Publication Data
US 2019/0011771 A1 Jan. 10, 2019

(30) Foreign Application Priority Data
Mar. 14, 2017 (CN) .......................... 2017 1 0148726

(51) Int. Cl.
*G02F 1/1335* (2006.01)
*G02F 1/1337* (2006.01)
(Continued)

(52) U.S. Cl.
CPC ...... *G02F 1/133528* (2013.01); *G02F 1/1337* (2013.01); *G02F 1/1339* (2013.01);
(Continued)

(58) Field of Classification Search
CPC ............ G02F 1/1337; G02F 1/133512; G02F 1/33528; G02F 1/133514; G02F 1/1368
See application file for complete search history.

(56) References Cited

U.S. PATENT DOCUMENTS

| 5,805,250 A * | 9/1998 | Hatano | ................... G02B 27/26 349/96 |
| 2012/0229736 A1* | 9/2012 | Osaki | ................ G02F 1/133512 349/96 |
| 2013/0128192 A1* | 5/2013 | Ishikawa | ........... G02F 1/133512 349/96 |

FOREIGN PATENT DOCUMENTS

| CN | 102096230 A | 6/2011 |
| CN | 103576390 A | 2/2014 |

(Continued)

OTHER PUBLICATIONS

Songjiang Wu, the International Searching Authority written comments, dated Nov. 2017, CN.

*Primary Examiner* — Dung T Nguyen

(57) ABSTRACT

The present application discloses a display apparatus includes a display panel including substrate, a second substrate and sealing portions, wherein the first substrate and the second substrate a arranged opposite to each other, the sealing portions are arranged between the first substrate and the second substrate, and the sealing portions are arranged to surround an active area of the display panel; and polarizers, including a first polarizer and a second polarizer. An outer side of the first substrate comprises bonding portions covering the sealing portions in corresponding positions and a polarizing portion in a middle position between the bonding portions, the first polarizer is arranged on the polarizing portion, the first polarizer and the second polarizer are (Continued)

arranged successively on the bonding portions, or the second polarizer and the first polarizer are successively on the bonding portions.

20 Claims, 9 Drawing Sheets

(51) Int. Cl.
    *G02F 1/1368*     (2006.01)
    *H01L 27/12*     (2006.01)
    *G02F 1/1339*     (2006.01)

(52) U.S. Cl.
    CPC ...... *G02F 1/1368* (2013.01); *G02F 1/133512* (2013.01); *G02F 1/133514* (2013.01); *H01L 27/1214* (2013.01); *G02F 2001/13398* (2013.01)

(56) References Cited

FOREIGN PATENT DOCUMENTS

| | | |
|---|---|---|
| CN | 104777662 A | 7/2015 |
| CN | 104950525 A | 9/2015 |
| CN | 106483706 A | 3/2017 |

\* cited by examiner

DISPLAY APPARATUS

TECHNICAL FIELD

The present application relates to the technical field of display, and particularly relates to a display apparatus.

BACKGROUND

Liquid crystal display apparatuses have numerous advantages, such as a thin body, power savings, no radiation, etc. and are widely used. Most liquid crystal display apparatuses in the current market are backlit liquid Crystal display apparatuses, each including a liquid crystal panel and a backlight module. Working principle of the liquid crystal panel is that liquid crystals are put in two parallel glass substrates, and a driving voltage is applied to the two glass substrates to control rotation of the liquid crystals, to refract light rays of the backlight module to generate a picture.

Thin film transistor-liquid crystal display apparatuses (TFT-LCD apparatuses) currently maintain a leading status in the display field because of low power consumption, excellent picture quality, high production yield, and other properties. Similarly, the TFT-LCD apparatus comprises a liquid crystal panel and a backlight module. The liquid crystal panel comprises a color filter substrate (CF substrate), a thin film transistor substrate (TFT substrate) and a mask, and transparent electrodes on respective inner sides of the above substrates. A layer of liquid crystals (LCs) is positioned between two substrates.

However, a display panel, without borders at four edges, generally needs to coat a black border, such as BM, on a back surface of glass, to prevent light leakage of metal at edges of the panel. BM technology, at an outer side, is conducted by turning over the glass, causing high scuffing risk of front may technology. Both of investment cost of the apparatus and production efficiency are poor.

SUMMARY

A technical problem to be solved by the present application is to provide, a display apparatus which can reduce reflecting, light and realize high production efficiency.

The purpose of the present application is achieved through the following technical solution:

A display apparatus comprises:

a display panel, comprising a first substrate, a second substrate and sealing portions, where the first substrate and the second substrate are arranged opposite to each other, the sealing portions are arranged between the first substrate and the second substrate, and the sealing portions are arranged to surround an active area of the display panel; and polarizers, comprising a first polarizer and a second polarizer, wherein an outer side of the first substrate comprises bonding portions covering the sealing portions in corresponding positions and a polarizing portion in a middle position between the bonding portions, the first polarizer is arranged on the polarizing portion, the first polarizer and the second polarizer are arranged successively on the bonding portions, or the second polarizer and the first polarizer are successively on the bonding portions.

A layer of the first polarizer and a layer of the second polarizer are arranged successively on the bonding portions. The first polarizer is arranged on one side close to the first substrate, and a layer of the first polarizer is arranged on the polarizing portion. An embodiment of stacked polarizers of the bonding portions is described.

A layer of the second polarizer and a layer of the first polarizer are arranged successively on the bonding portions. The second polarizer is arranged on one side close, to the first substrate, and a layer of the first polarized is arranged on the polarizing portion. An embodiment of stacked polarizers of the bonding portions is described.

A layer of the first polarizer is arranged on the second portion, and a layer of the first polarizer is arranged on both ends of the first polarizer. The specific arrangement of a second embodiment of the stacked polarizers of the bonding portions on the second polarizing portion is described.

Wherein a thickness of the first polarizer is equal to a thickness of the second polarizer. The arrangement of the polarizers of the bonding portions can be used for blocking the reflecting light of a metal wire on the periphery, and the arrangement of the thickness of each polarizer is described herein.

The display panel comprises an array substrate and a color filter substrate. The first polarizer is a polarizer used on an array substrate side, and the second polarizer is a polarizer used on a color filter substrate side. Specific forms and functions of the first polarizer and the second polarizer are described.

Wherein a width of the first substrate is greater than a width of the second substrate. The second polarizer is arranged on an outer side of the second substrate. And a width of the polarizer arranged on the outer side of the first substrate is equal to the width of the first substrate. The width of the polarizer arranged on the outer side of the second substrate is equal to the width of the second substrate. The configuration of relative widths of each substrate and each polarizer in the display apparatus is defined.

The functional layer of the active area is arranged between the two sealing portions, and widths of the two sealing portions and the functional layer are less than the width of the second substrate. The sealing portions are used for connection, etc., and are in the same layer as the functional layer. The configuration of widths and positions of the sealing portions compared with the substrate is described herein.

Wherein the functional layer comprises an array layer, a first alignment layer, a liquid crystal layer, a second alignment layer and a color filter layer successively from top to bottom. The specific configuration of the first active area is defined.

Wherein the array layer comprises an active switch, and the active switches are thin film transistors. This is the composition of the array layer.

Since the polarizing function of the first polarizer on the outer side of the substrate is set in such a manner that the bonding portions are arranged on both ends and the polarizing portion is arranged in the middle in the present application, different polarizers are respectively arranged in the positions. The combinatorial property of the polarizers is used to eliminate a light reflecting phenomenon of the metal on the periphery of the display apparatus, reduce poor scratch caused by the turning of the substrate, reduce the manufacturing process and reduce the cost.

DESCRIPTION OF THE DRAWINGS

The drawings included are used for providing further understanding of embodiments of the present application, constitute portion of the description, are used for illustrating implementation manners of the present application, and interpreting principles of the present application together with text description. Apparently, the drawings in the following description are merely some embodiments of the present application, and for those of ordinary skill in the art, other drawings can also be obtained according to the drawings without contributing creative labor. In the drawings.

Figure 1:
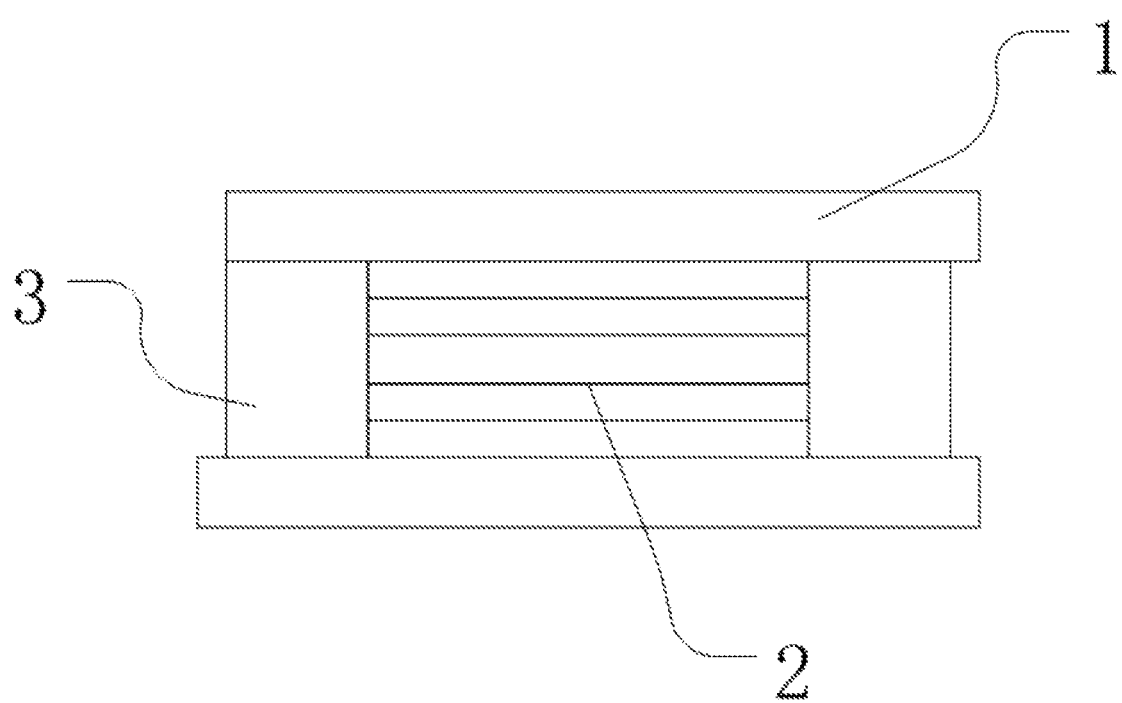
FIG. 1 is a structural schematic diagram of a display panel of an embodiment of the present application.

Where, 1, substrate; 11. first substrate; 111, bonding portion; 112. polarizing portion; 12, second substrate; 2, functional layer of first active area; 21, first alignment layer; 22, second alignment layer; 23, liquid crystal layer; 3, sealing portion; 31, first sealing portion; 32, second sealing portion; 4, array layer; 5, color filter layer; 51, optical processing portion 52, middle portion; 6, functional layer of second active area; 7, polarizer; 71, first polarizer; 711, screen printing portion; and 72, second polarizer.

DETAILED DESCRIPTION

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated apparatus or element must have a specific direction or constructed and operated in a specific direction, and therefore, shall not be understood as a limitation to the present application. Furthermore, the terms such as "first" and "second" are only used for the purpose of description, rather than being understood to indicate or imply relative importance or hint the number of indicated technical features. Thus, the feature limited by "first" and "second" can explicitly or impliedly comprise one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation", "bonded" and "bonding" shall be understood in broad sense, and for example, may refer to fixed bonding or detachable bonding or integral bonding, may refer to mechanical bonding or electrical bonding, and may refer to direct bonding or indirect bonding through an intermediate medium or inner communication of two elements. For those of ordinary skill in the art, the meanings of the above terms in the present application may be understood according to specific conditions.

The terms used herein are intended to merely describe specific embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The present application will be further described in detail below in combination with the drawings and preferred embodiments.

In an embodiment of the present application, as shown in FIG. 1, the display panel comprises a substrate comprising a first substrate and a second substrate which are arranged opposite to each other; sealing portions, wherein the sealing portions are arranged between the first substrate and the second substrate, and the sealing portions are arranged to surround an active area of the display panel; and a functional layer which is a functional layer 2 of a first active area herein, wherein the functional layer is arranged between the two sealing portions, and a side surface of the substrates is level with one end of the sealing portions that is away from the functional layer. The substrate is edged so that the substrate is level with one end of the sealing portions that is away from the functional layer, and edges of the border are narrowed by milling the edges, thereby achieving a narrow border and better visual sense.

Specifically, the substrate may be made of glass material. Glass has a wide material range, and is convenient in processing and use.

Specifically, the substrate is edged through grindstone. The characteristic of the grindstone is used in a specific manner for edging the substrate.

Specifically, the side surface of the substrate is cambered surface, and a chamfer after edging the substrate is right angle. The chamfer of a right angle is easier to operate technologically without additional operation procedures, thereby saving procedures and cost. Alternatively, the side surface of the substrate is cambered surface. The cambered surface is arranged to be smoother in transition, and can better protect the panel when resisting collision and the like.

Figure 2:
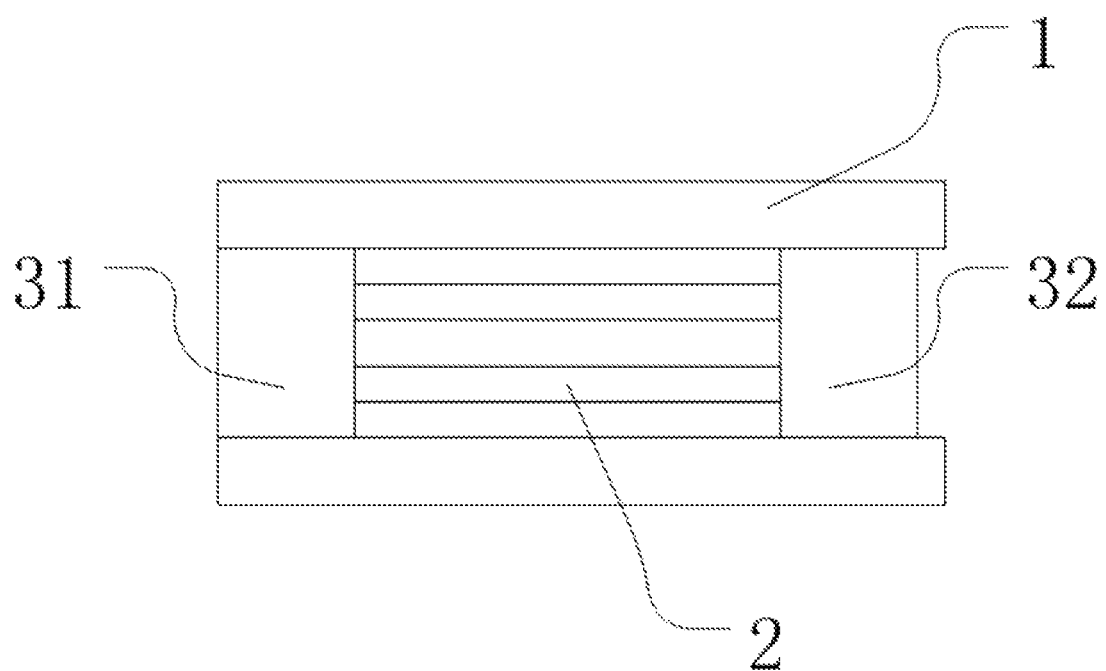
FIG. 2 is a structural schematic diagram of a display panel of an embodiment of the present application.

In another embodiment of the present application, as shown in FIG. 2, the display panel comprises a substrate comprising a first substrate and a second substrate which are arranged opposite to each other; sealing portions, wherein the sealing portions are arranged between the first substrate and the second substrate, and the sealing portions are arranged to surround an active area of the display panel; and a functional layer which is a functional layer 2 of a first active area herein, wherein the functional layer is arranged between the two sealing portions, and the side surface of the substrates is level with one end of the sealing portions that is away from the functional layer. The sealing portions comprise a first sealing portion arranged on a first side of the functional layer and a second sealing portion arranged on a second side of the functional layer. The side surface of the substrates is level with one end of the first sealing portion that is away from the functional layer; and/or the side surface of the substrates is level at one end of the second sealing portion that is away from the functional layer. The left and/or right of the substrate can be edged as required so that the substrate is level with one end of the sealing portions that is away from the functional layer, realizing higher utilization rate, convenience and high efficiency. The substrate is edged so that the substrate is level with one end of the sealing portions that is away from the functional layer, and edges of the border are narrowed by milling the edges, thereby achieving an effect of a narrow border and better visual sense.

Specifically, the substrate may be made of glass material. Glass has a wide material range, and is convenient in processing and use.

Specifically, the substrate is edged through grindstone. The characteristic of the grindstone is used in a specific manner for edging the substrate.

Specifically, the side surface of the substrate is cambered surface, and a chamfer after edging the substrate is right angle. The chamfer of a right angle is easier to operate technologically without additional operation procedures, thereby saving procedures and cost. Alternatively, the side surface of the substrate is cambered surface. The cambered surface is arranged to be smoother in transition, and can better protect the panel when resisting collision and the like.

Figure 3:
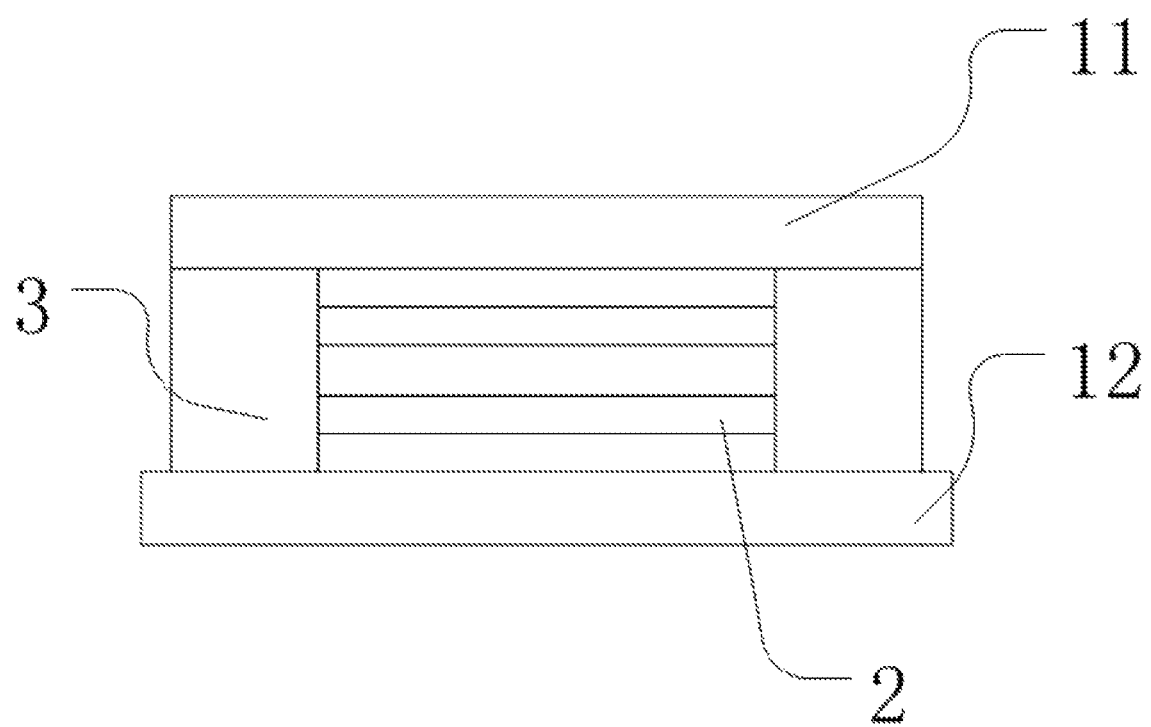
FIG. 3 is a structural schematic diagram of a display panel of an embodiment of the present application.

In another embodiment of the present application, as shown in FIG. 3, the display panel comprises a substrate comprising a first substrate and a second substrate which are arranged opposite to each other; sealing portions, wherein the sealing portions are arranged between the first substrate and the second substrate, and the sealing portions are arranged to surround an active area of the display panel; and a functional layer which is a functional layer 2 of a first active area herein, where the functional layer is arranged between the two sealing portions, and the side surface of the substrates is level with one end of the sealing portions that is away from the functional layer. The side surfaces of the first substrate are level with the ends of the sealing portions that are away from the functional layer; and/or the side surfaces of the second substrate are level with the ends of the sealing portions that are away from the functional layer. The first substrate and/or the second substrate can be edged as required so that the substrate is level with one end of the sealing portions that is away from the functional layer, and an upper substrate and a lower substrate can be, alternatively processed, realizing higher utilization rate, convenience and high efficiency. The substrate is edged so that the substrate is level with one end of the sealing portions that is away from the functional layer, and edges of the border are narrowed by milling the edges, thereby achieving an effect of a narrow border and better visual sense.

Specifically, the substrate may be made of glass material. Glass has a wide material range, and is convenient in processing and use.

Specifically, the substrate is edged through grindstone. The characteristic of the grindstone is used in a specific manner for edging the substrate.

Specifically, the side surface of the substrate is cambered surface, and a chamfer after edging the substrate is right angle. The chamfer of a right angle is easier to operate technologically without additional operation procedures, thereby saving procedures and cost. Alternatively, the side surface of the substrate is cambered surface. The cambered surface is arranged to be smoother in transition, and can better protect the panel when resisting collision and the like.

Specifically, the functional layer 2 of the first active area arranged on the two substrates comprises a color filter layer, a first alignment layer, a liquid crystal layer, a second alignment layer and an array layer successively from top to bottom, wherein the array layer comprises an active switch, and the active switches are thin film transistors.

Figure 4:
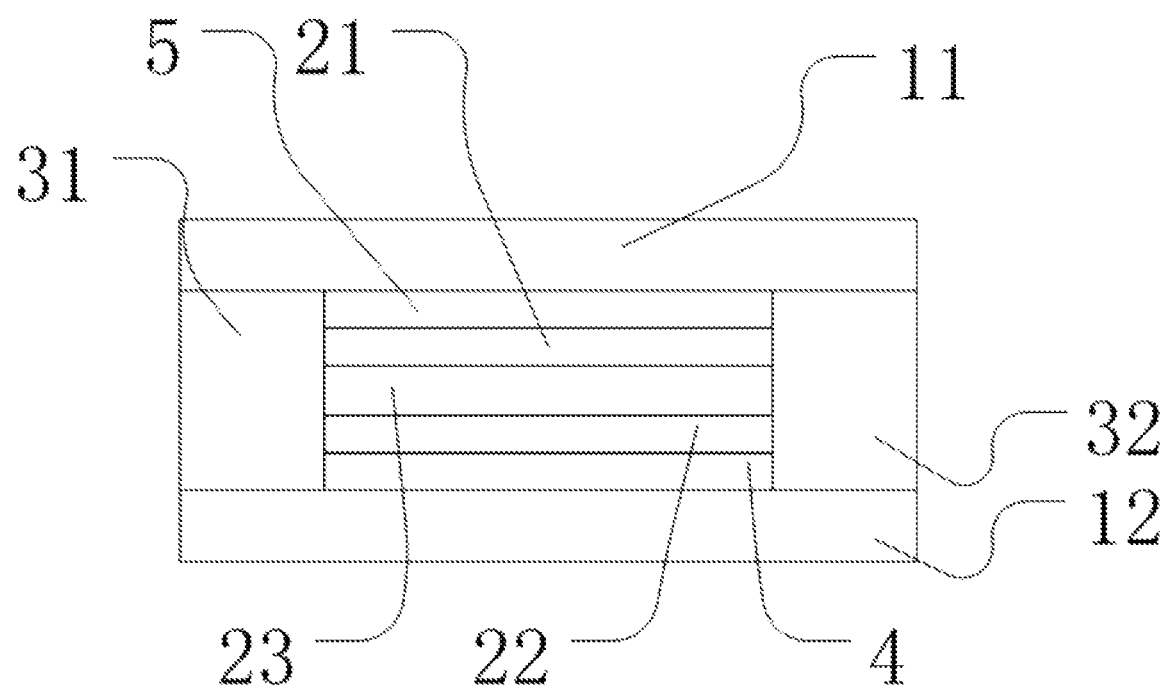
FIG. 4 is a structural schematic diagram of a display panel of an embodiment of the present application.

In another embodiment of the present application, as shown in FIG. 4, the display panel comprises a substrate comprising a first substrate and a second substrate which are arranged opposite to each other; sealing portions, wherein the sealing portions are arranged between the first substrate and the second substrate, and the sealing portions are arranged to surround an active area of the display panel; and a functional, layer which is a functional layer 2 of a first active area herein, wherein the functional layer is arranged between the two sealing portions, and the side surface of the substrates is level with one end of the sealing portions that is away from the functional layer. The sealing portions comprise a first sealing portion arranged on a first side of the functional layer and a second sealing portion arranged on a second side of the functional layer. The side surface of the first substrate is level with one end of the first sealing portion that is away from the functional layer; and the opposite side surface of the first substrate is level with one end of the second sealing portion that is away from the functional layer. The side surface of the second substrate is level with one end of the first sealing portion that is away from the functional layer; and the opposite side surface of the second substrate is level with one end of the second sealing portion that is away from the functional layer. This is an embodiment that the left and the right of the upper substrate and the lower substrate are edged, thereby better satisfying the visual sense of a user and enhancing user experience. The substrate is edged so that the substrate is level with one end of the sealing portions that is away from the functional layer, and edges of the border are narrowed by milling the edges, thereby achieving an effect of a narrow border and better visual sense.

Specifically, the substrate may be made of glass material. Glass has a wide material range, and is convenient in processing and use.

Specifically, the substrate is edged through grindstone. The characteristic of the grindstone is used in a specific manner for edging the substrate.

Specifically, the side surface of the substrate is cambered surface, and a chamfer after edging the substrate is right angle. The chamfer of a right angle is easier to operate technologically without additional operation procedures, thereby saving procedures and cost. Alternatively, the side surface of the substrate is cambered surface. The cambered surface is arranged to be smoother in transition, and can better protect the panel when resisting collision and the like.

Specifically, the functional layer 2 of the first active area arranged on the two substrates comprises a color filter layer, a first alignment layer, a liquid crystal layer, a second alignment layer and an array layer successively from top to bottom, wherein the array layer comprises an active switch, and the active switches are thin film transistors.

In another embodiment of the present application, the present application further discloses a display apparatus comprising a backlight module and the above display panel.

Figure 5:
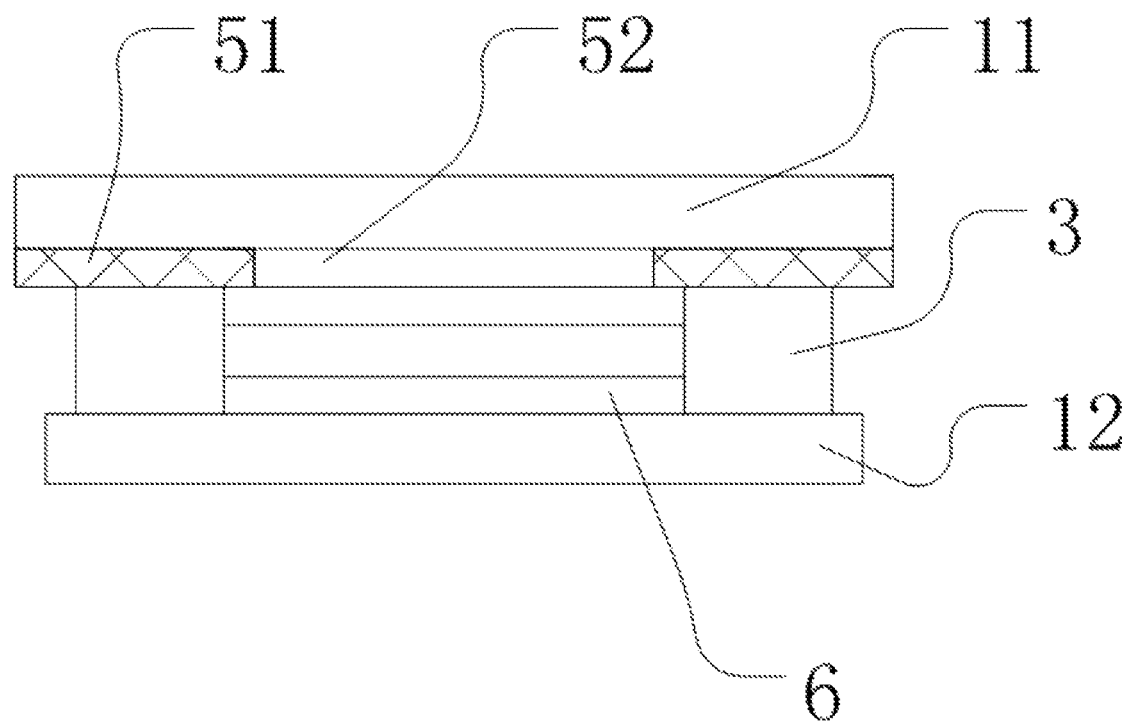
FIG. 5 is a structural schematic diagram of a display panel of an embodiment of the present application.

In another embodiment of the present application, as shown in FIG. 5, the display panel comprises a substrate comprising a first substrate and a second substrate which are arranged opposite to each other; sealing portions, wherein the sealing portions are arranged between the first substrate, and the second substrate and the sealing portions are arranged to surround an active area of the display panel; a color filter layer, wherein the color filter layer and the sealing portions are arranged between the first substrate and the second substrate, and the color filter layer comprises optical processing portions covering the sealing portions, and the optical processing portions are made of color filter material of a carburized structure. The optical processing portions made of color filter material of a carburized structure are arranged on both ends of the color filter layer. The both ends slightly extend to an Active Area (AA) inwards, to prevent light leakage of metal at the edge of the display panel, shorten the technical production time and material cost, reduce investment cost of the apparatus and obtain high production yield.

Specifically, each optical processing portion comprises a lightproof carburized layer and a photic layer covered on the surface of the carburized layer. In a specific configuration, the optical processing portions can also of course completely comprise lightproof carburized layers, wherein black layers are obtained after carbonizing the carburized layers by high-intensity optical energy, and thickness of the black layers is less than that of the color filter layer. The black layers obtained after carbonizing treatment can be used to prevent light leakage.

In another embodiment of the present application, the display panel comprises a substrate comprising a first substrate and a second substrate which are arranged opposite to each other; sealing portions, wherein the sealing portions are arranged between the first substrate and the second substrate, and the sealing portions are arranged to surround an active area of the display panel; a color filter layer, wherein the color filter layer and the sealing portions are arranged between the first substrate and the second substrate, the color filter layer comprises optical processing portions covering the sealing portions, and the optical processing portions are made of color filter material of a carburized structure. The optical processing portions made of color filter material of a carburized structure are arranged on both ends of the color filter layer. The both ends slightly extend to an Active Area (AA) inwards, to prevent light leakage of metal at the edge of the display panel, shorten the technical production time and material cost, reduce investment cost of the apparatus and obtain high production yield. The high-intensity optical energy can use lasers. The lasers have a wide material range, directional luminescence and very high brightness, and can well use as a tool for carbonizing the optical processing portions.

Specifically, each optical processing portion comprises a lightproof carburized layer and a photic layer covered on the surface of the carburized layer. In a specific configuration, the optical processing portions can also of course completely comprise lightproof carburized layers, wherein black layers are obtained after carbonizing the carburized layers by high-intensity energy, and the thickness of the black layers is less than that of the color filter layer. The black layers obtained after carbonizing treatment can be used to prevent light leakage.

Figure 6:
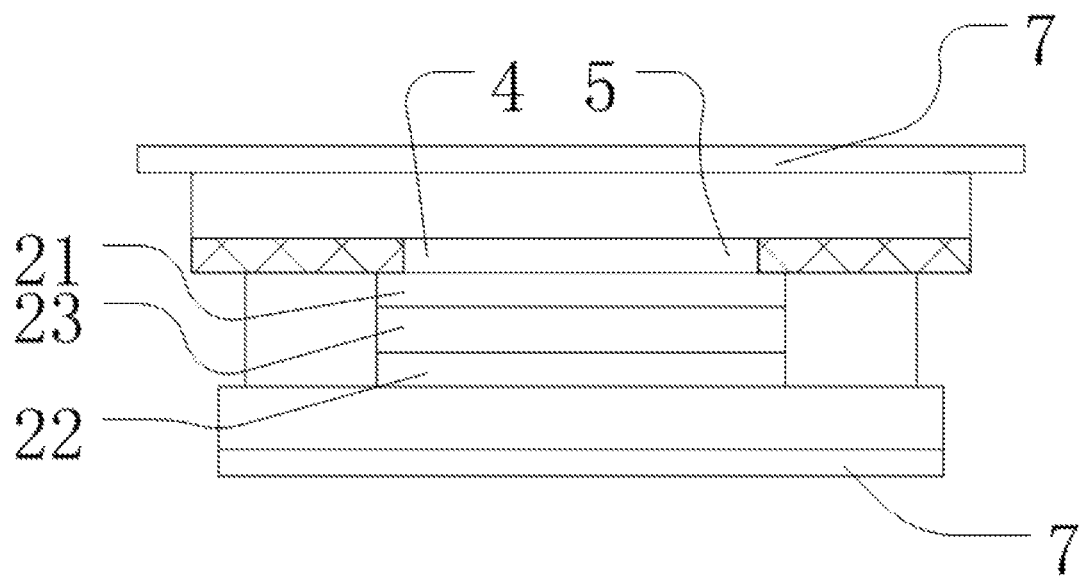
FIG. 6 is a structural schematic diagram of a display apparatus of an embodiment of the present application.

In another embodiment of the present application, as shown in FIG. 6, the display panel comprises a substrate comprising a first substrate and a second substrate which are arranged opposite to each other; sealing portions, wherein the sealing portions are arranged between the first substrate, and the second substrate and the sealing portions are arranged to surround an active area of the display panel; a color filter layer, wherein the color filter layer and the sealing portions are arranged between the first substrate and the second substrate, and the color filter layer comprises optical processing portions covering the sealing portions, and the optical processing portions are made of color filter material of a carburized structure. The display panel further comprises an array layer. The color filter layer and the array layer jointly cover the first substrate. The functional layer of the active area is arranged between the two sealing portions. The functional layer is arranged between the color filter layer and the second substrate. The functional layer comprises a first alignment layer a liquid crystal layer and a second alignment layer successively from top to bottom. Specific embodiments under a color filter on array (COA) technology are simultaneously used herein. The high-intensity optical energy can use lasers. The lasers have a wide material range, directional luminescence and very high brightness, and can well use as a tool for carbonizing the optical processing portions. The optical processing portions made of color filter material of a carburized structure are arranged on both ends of the color filter layer. The both ends slightly extend to an Active Area (AA) inwards, to prevent light leakage of metal at the edge of the display panel, shorten the technical production time and material cost, reduce investment cost of the apparatus and obtain high production yield.

Specifically, each optical processing portion comprises a lightproof carburized layer and a photic layer covered on the surface of the carburized layer. In a specific configuration, the optical processing portions can also of curse completely comprise lightproof carburizing layers, wherein black layers are obtained after carbonizing the carburized layers are carbonized by high-intensity optical energy, and the thickness of the black layers is less than that of the color filter layer. The black layers obtained after carbonizing treatment can be used to prevent light leakage.

Wherein the array layer comprises an active switch, and the active switches are thin film transistors. This is the composition of the array layer.

Wherein the color filter layer further comprises a middle portion arranged between the two optical processing portions, and the middle portion comprises a red color filter layer, a green color filter layer and a blue color filter layer. The color filter layer includes but not limited to the red color filter layer, the green color filter layer and the blue color filter layer, and can also include color filter layers corresponding to the colors of White (W), Yellow (Y), etc., so that the colors are abundant and a display effect is also better. Width of the middle portion is less than or equal to width of the functional layer 6 of the second active area.

Figure 7:
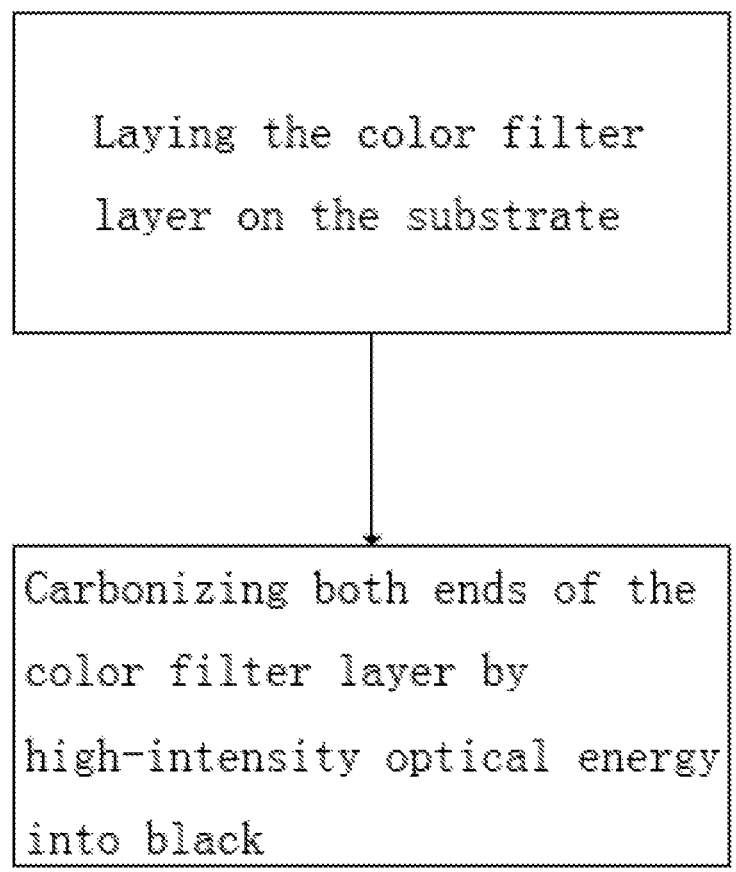
FIG. 7 is a flowchart of a manufacturing process of a display panel of an embodiment of the present application.

In another embodiment of the present application, as shown in FIG. 7, the present application further discloses a manufacturing process of a display panel. The display panel comprises a substrate and a color filter layer. The manufacturing process comprises the steps:

laying the color filter layer on the substrate; and processing the optical processing portions on both ends of the color filter layer by high-intensity optical energy.

The substrate comprises a first substrate and a second substrate which are arranged opposite to each other. The display panel further comprises sealing portions which are arranged between the first substrate and the second substrate, and are arranged to surround the active area of the display panel. The color filter layer and the sealing portions are arranged between the first substrate and the second substrate. The color filter layer comprises optical processing portions covering the sealing portions. The optical processing portions are made of color filter material of a carburized structure.

Specifically, after both ends of the color filter layer are carbonized into black by high-intensity optical energy, the manufacturing process comprises the steps:

obtaining a gate layer on the substrate laid with the color filter layer through coating, exposing, developing and etching;

obtaining an amorphous silicon layer on the gate layer through coating, exposing, developing and etching;

obtaining a source layer and a drain layer on the amorphous silicon layer through coating, exposing, developing and etching;

obtaining a protective layer on the source layer and the drain layer through coating, exposing, developing and etching; and obtaining a transparent conducting layer on the protective layer through coating, exposing, developing and etching.

Wherein the high-intensity optical energy can use lasers. The lasers have a wide material range, directional luminescence and very high brightness, and can well use as a tool for carbonizing the optical processing portions.

In another embodiment of the present application, as shown in FIG. 6, the present application further discloses a display apparatus comprising a backlight module and the above display panel.

Figure 8:
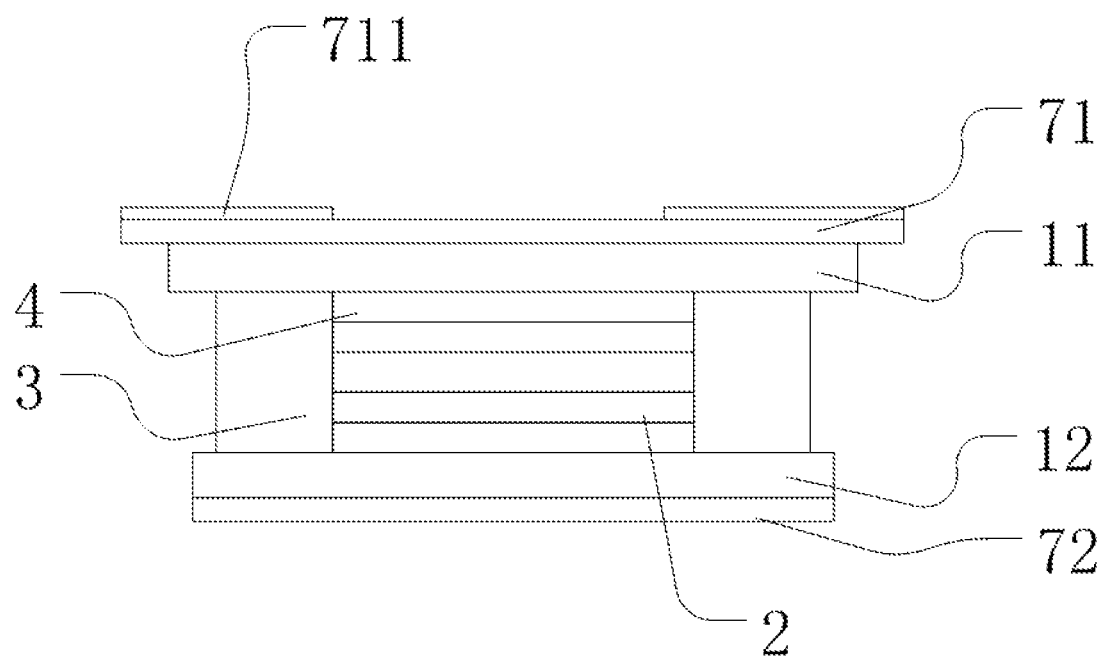
FIG. 8 is a structural schematic diagram of a display apparatus of an embodiment of the present application.

In another embodiment of the present application, as shown in FIG. 8, the display panel comprises a first substrate, a second substrate and sealing portions, wherein the first substrate and the second substrate are arranged opposite to each other, the sealing portions are arranged between the first substrate and the second substrate, and the sealing portions are arranged to surround an active area of the display panel; and polarizers, wherein the polarizers comprise a first polarizer arranged on an outer side of the first substrate, the first polarizer comprises a screen printing portion covering the sealing portions in corresponding positions, the screen printing portion is made of polarizing material which bears screen printing by a surface, and a lightproof layer is made on the surface of the screen printing portion through screen printing. The lightproof layer is arranged on both ends of the polarizer on the outer side of the substrate through screen printing. The both ends slightly extend to an Active Area (AA) inwards, to prevent light leakage of metal at the edge of the display panel, shorten the technical production time and material cost, reduce investment cost of the apparatus and obtain high production yield.

Screen printing, also called silk-screen printing, is one of fabrication processes of a circuit board. On the existing screen cloth with negative patterns, a proper amount of printing ink (i.e., photoresist) is squeezed out with a scraper. Positive patterns are formed through partial screen cloth and are printed on a flat copper surface of the substrate to form a covering photoresist, for preparing for subsequent selective etching or electroplating processing. This transfer manner is known as "screen printing" and can also be used in other fields. Herein, the lightproof layer can be arranged on both sides of both ends of the polarizers.

The lightproof layer is arranged on the surface of one side of the screen printing portion that is away from the first substrate. Arranging the lightproof layer on the outer side of the laid polarizer can better reduce the technological difficulty and save cost.

Specifically, a thickness of the lightproof layer is less than a thickness of the first polarizer.

Specifically, the width of the first substrate is greater than the width of the second substrate. The polarizer comprises a second polarizer arranged on an outer side of the second substrate. Width of the first polarizer is greater than the width of the first substrate. Width of the second polarizer is equal to the width of the second substrate, wherein the functional layer of the active area, also called a functional layer 2 of the first active area, is arranged between the two sealing portions, and widths of the two sealing portions and the functional layer are less than the width of the second substrate. The sealing portions are used for connection, etc., and are in the same layer as the functional layer.

Specifically, the functional layer comprises an array layer, a first alignment layer, a liquid crystal layer, a second alignment layer and a color filter layer successively from top to bottom, wherein the array layer is arranged on the first substrate, the array layer comprises an active switch, and the active switches are thin film transistors.

Specifically, the first substrate may be made of glass material, and the second substrate may be made of glass material. Glass has a wide material range, and is convenient in processing and use.

In another embodiment of the present application, the display panel comprises a first substrate, a second substrate and sealing portions, wherein the first substrate and the second substrate are arranged opposite to each other, the sealing portions are arranged between the first substrate and the second substrate, and the sealing portions are arranged to surround an active area of the display panel; and polarizers, wherein the polarizers comprise a first polarizer arranged on an outer side of the first substrate, the first polarizer comprises a screen printing portion covering the sealing portions in corresponding positions, the screen printing portion is made of polarizing material which bears screen printing by a surface, and a lightproof layer is made on the surface of the screen printing portion through screen printing. The functional layer of the active area, also called a functional layer 6 of the second active area, is also arranged between the two sealing portions. The functional layer of the second active area comprises a first alignment layer, a liquid crystal layer and a second alignment layer successively from top to bottom. Meanwhile, the lightproof layer is arranged on both ends of the polarizer on the outer side of the substrate through screen printing by a color filter on array (COA) technology. The both ends slightly extend to an Active Area (AA) inwards, to prevent light leakage of metal at the edge of the display panel, shorten the technical production time and material cost, reduce investment cost of the apparatus and obtain high production yield.

The lightproof layer is arranged on the surface of one side of the screen printing portion that is away from the first substrate. Arranging the lightproof layer on the outer side of the laid polarizer can better reduce the technological difficulty and save cost.

Specifically, the thickness of the lightproof layer is less than the thickness of the first polarizer.

Specifically, the width of the first substrate is greater than the width of the second substrate. The polarizer comprises a second polarizer arranged on an outer side of the second substrate. The width of the first polarizer is greater than the width of the first substrate. The width of the second polarizer is equal to the width of the second substrate.

The widths of the two sealing portions and the functional layer are less than the width of the second substrate. The sealing portions are used for connection, etc., and are in the same layer as the functional layer.

Specifically, the functional layer comprises an array layer, a first alignment layer, a liquid crystal layer, a second alignment layer and a color filter layer successively from top to bottom, wherein the array layer is arranged on the first substrate, the array layer comprises an active switch, and the active switches are thin film transistors.

Specifically, the first substrate, may be made of glass material, and the second substrate may be made of glass material. Glass has a wide material range, and is convenient in processing and use.

Figure 9:
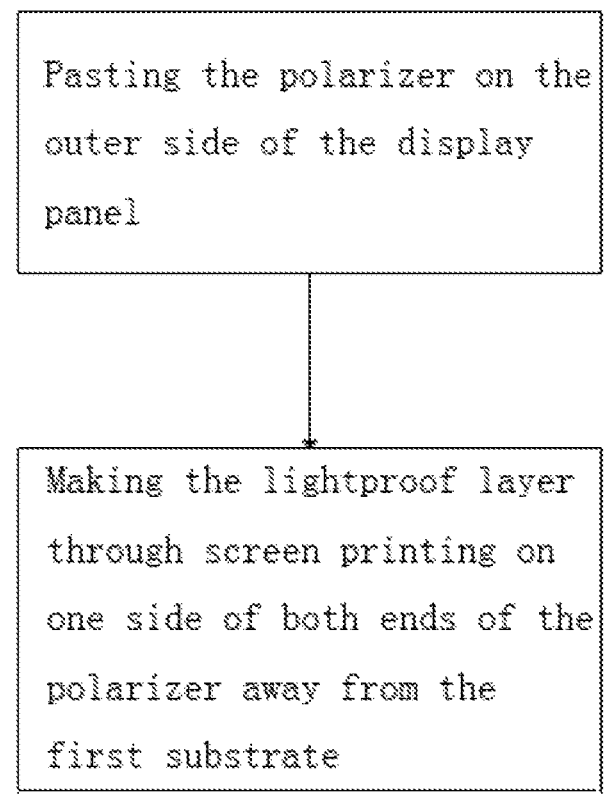
FIG. 9 is a flowchart of a manufacturing process of a display apparatus of an embodiment of the present application.

In another embodiment of the present application, as shown in FIG. 9, the present application further discloses a manufacturing process of the display apparatus. The display apparatus comprises polarizers and a display panel. The display panel comprises a first substrate a second substrate and sealing portions arranged between the first substrate and the second substrate. The polarizer comprises a first polarizer arranged on the outer side of the first substrate. The manufacturing process comprises the steps:

pasting the polarizer on the outer side of the display panel; and making the lightproof layer on the surfaces of both ends of the first polarizer through screen printing.

The first substrate and the second substrate are arranged opposite to each other. The sealing portions are arranged to surround the active area of the display panel. The first polarizer comprises a screen printing portion covering the sealing portions in corresponding positions. The screen printing portion is made of polarizing material which bears screen printing by a surface. The lightproof layer is made on the surface of the screen printing portion through screen printing.

The lightproof layer is arranged on the surface of one side of the screen printing portion that is away from the first substrate, and the thickness of the lightproof layer is less than the thickness of the first polarizer. The width of the first substrate is greater than the width of the second substrate. The polarizer comprises a second polarizer arranged on an outer side of the second substrate. The width of the first polarizer is greater than the width of the first substrate. The width of the second polarizer is equal to the width of the second substrate.

Figure 10:
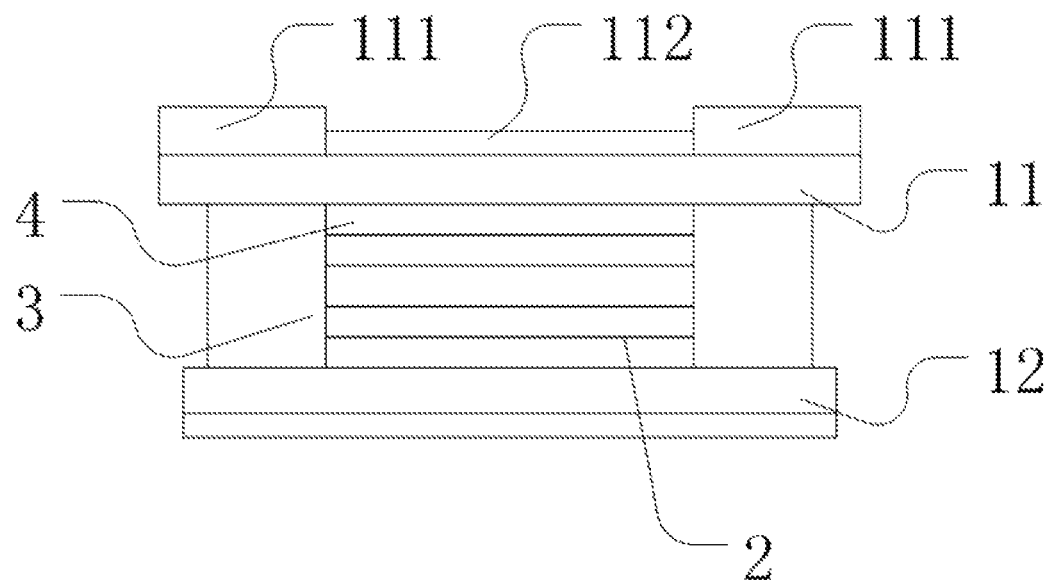
FIG. 10 is a structural schematic diagram of a display apparatus of an embodiment of the present application.

In another embodiment of the present application, as shown in FIG. 10, the display apparatus comprises a display panel comprising a first substrate, a second substrate and sealing portions, wherein the first substrate and the second substrate are arranged opposite to each other, the sealing portions are arranged between the first substrate and the second substrate, and the sealing portions are arranged to surround an active area of the display panel; and polarizers, wherein the polarizers comprise a first polarizer and a second polarizer, the outer side of the first substrate comprises bonding portions covering the sealing portions in corresponding positions and a polarizing portion in a middle position between the bonding portions, the first polarizer is arranged on the polarizing portion, the first polarizer and the second polarizer are arranged successively on the bonding portions, or the second polarizer and the first polarizer are successively on the bonding portions. The polarizing function of the first polarizer on the outer side of the substrate is set in such a manner that the bonding portions are arranged on both ends and the polarizing portion is arranged in the middle. Different polarizers are respectively arranged in the positions. The combinatorial property of the polarizers is used to eliminate a light reflecting phenomenon of the metal on the periphery of the display apparatus, reduce poor scratch caused by the turning of the substrate, reduce the manufacturing process and reduce the cost.

Herein, the inventor also thinks of coating a layer of BM on the outer side of the array substrate or additionally coating a layer of low-reflectivity material in front of the first layer of metal to solve the light reflecting problem. However, compared with the embodiment of the present application, one manufacturing procedure is added and the risk of technical scuffing on an array side is increased if BM is coated. In the present patent, the reflecting light of a metal wire on the periphery is blocked through the polarizer without adding the manufacturing procedure.

Figure 11:
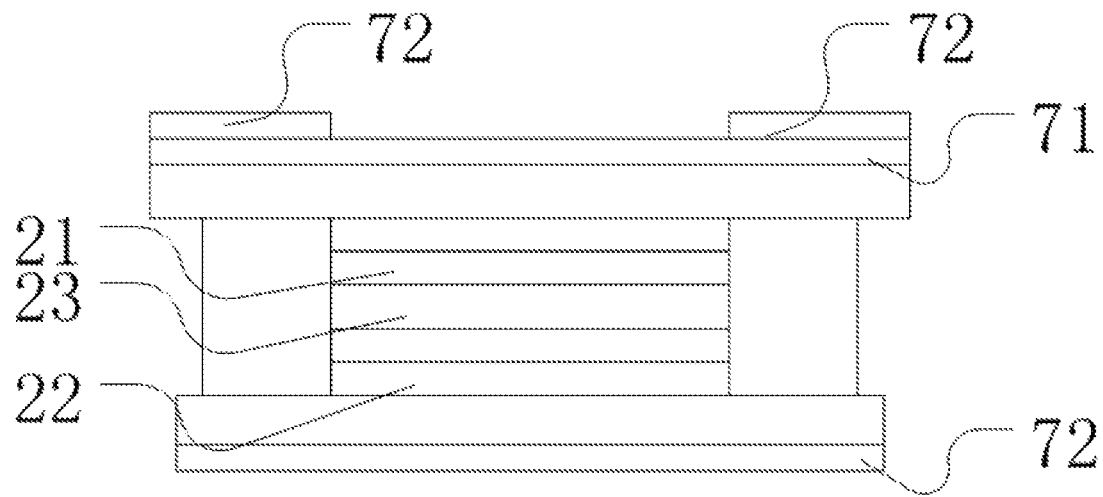
FIG. 11 is a structural schematic diagram of a display apparatus of an embodiment of the present application.

In another embodiment of the present application, as shown in FIG. 11, the display apparatus comprises a display panel which comprises a first substrate, a second substrate and sealing portions, where the first substrate and the second substrate are arranged opposite to each other, the sealing portions are arranged between the first substrate and the second substrate, and the sealing portions are arranged to surround an active area of the display panel; and polarizers, wherein the polarizers comprise a first polarizer and a second polarizer, the outer side of the first substrate comprises bonding portions covering the sealing portions in corresponding positions and a polarizing portion in a middle position between the bonding portions, a layer of the first polarizer and a layer of the second polarizer are arranged successively on the bonding portions. The first polarizer is arranged on one side close to the first substrate. A layer of the first polarizer is arranged on the polarizing portion. The polarizing function of the first polarizer on the outer side of the substrate is set in such a manner that the bonding portions are arranged on both ends and the polarizing portion is arranged in the middle. Different polarizers are respectively arranged in the positions. The combinatorial property of the polarizers is used to eliminate a light reflecting phenomenon of the metal on the periphery of the display apparatus, reduce poor scratch caused by the turning of the substrate, reduce the manufacturing process and reduce the cost.

Specifically, the thickness of the first polarizer is equal to the thickness of the second polarizer.

Specifically, the display panel comprises an array substrate and a color filter substrate. The first polarizer is a polarizer used on an array substrate side. The second polarizer is a polarizer used on a color filter substrate side. Specific forms and functions of the first polarizer and the second polarizer are described.

Specifically, the width of the first substrate is greater than the width of the second substrate. The second polarizer is arranged outer side of the second substrate. The width of the polarizer arranged on the outer side of the first substrate is equal to the width of the first substrate. The width of the polarizer arranged on the outer side of the second substrate is equal to the width of the second substrate.

Specifically, the functional layer of the active area, i.e., a functional layer 2 of the first active area herein, is arranged between the two sealing portions, and the widths of the two sealing portions and the functional layer are less than the width of the second substrate. The sealing portions are used for connection, etc., and are in the same layer as the functional layer.

Specifically, the functional layer comprises an array layer, a first alignment layer, a liquid crystal layer, a second alignment layer and a color filter layer successively from top to bottom, wherein the array layer comprises an active switch, and the active switches are thin film transistors.

Figure 12:
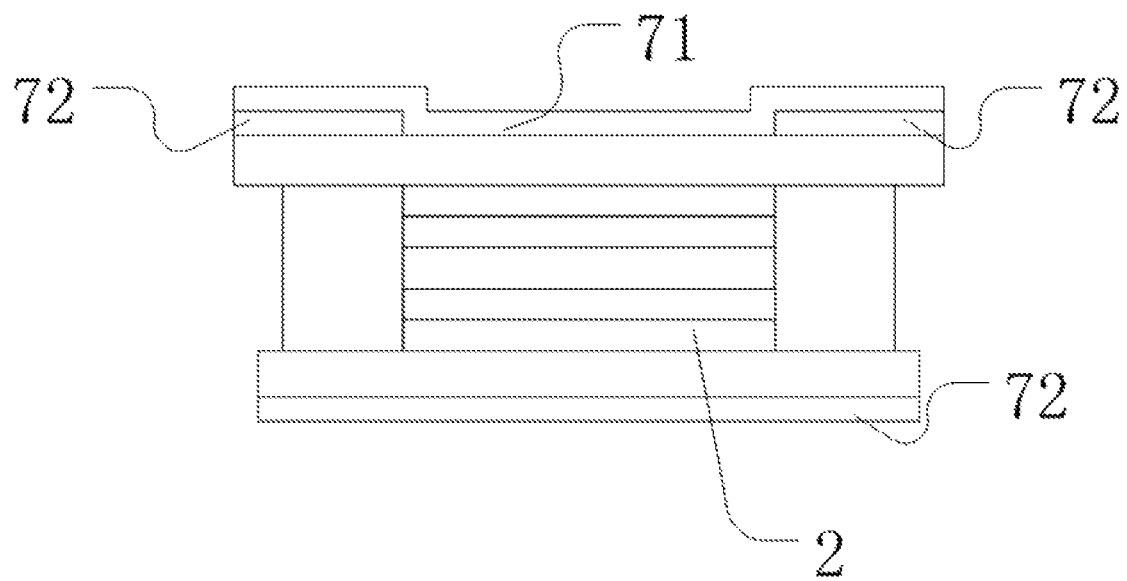
FIG. 12 is a structural schematic diagram of a display apparatus of an embodiment of the present application.

In another embodiment of the present application, as shown in FIG. 12, the display apparatus comprises a display panel comprising a first substrate, a second substrate and sealing portions, wherein the first substrate and the second substrate are arranged opposite to each other, the sealing portions are arranged between the first substrate and the second substrate, and the sealing portions are arranged to surround an active area of the display panel; and polarizers, wherein the polarizers comprise a first polarizer and a second polarizer, the outer side of the first substrate comprises bonding portions covering the sealing portions in corresponding positions and a polarizing portion in a middle position between the bonding portions, a layer of the second polarizer and a layer of the first polarizer are arranged successively on the bonding portions. The second polarizer is arranged on one side close to the first substrate. A layer of the first polarizer is arranged on the polarizing portion. The polarizing function of the first polarizer on the outer side of the substrate is set in such a manner that the bonding portions are arranged on both ends and the polarizing portion is arranged in the middle. Different polarizers are respectively arranged in the positions. The combinatorial property of the polarizers is used to eliminate a light reflecting phenomenon of the metal on the periphery of the display apparatus, reduce poor scratch caused by the turning of the substrate, reduce the manufacturing process and reduce the cost.

A layer of the first polarizer is arranged on the second polarizing portion, and a layer of the first polarizer is arranged on both ends of the first polarizer.

Specifically, the thickness of the first polarizer is equal to the thickness of the second polarizer.

Specifically, the display panel comprises an array substrate and a color filter substrate. The first polarizer is a polarizer used on an array substrate side. The second polarizer is a polarizer used on a color filter substrate side. Specific forms and functions of the first polarizer and the second polarizer are described.

Specifically, the width of the first substrate is greater than the width of the second substrate. The second polarizer is arranged on an outer side of the second substrate. The width of the polarizer arranged on the outer side of the first substrate is equal to the width of the first substrate. The width of the polarizer arranged on the outer side of the second substrate is equal to the width of the second substrate.

Specifically, the functional layer of the active area, i.e., a functional layer 2 of the first active area herein, is arranged between the two sealing portions, and the widths of the two sealing portions and the functional layer are less than the width of the second substrate. The sealing portions are used for connection, etc., and are in the same layer as the functional layer.

Specifically, the functional layer comprises an array layer, a first alignment layer, a liquid crystal layer, a second alignment layer and a color filter layer successively from top to bottom, wherein the array layer comprises an active switch, and the active switches are thin film transistors.

It should be noted that the substrate may be made of glass, plastics, etc. in the above embodiment.

In the above embodiment, the display panel of the present application may be a curved surface type panel.

In the above embodiment, the concepts of specific embodiments, in which the black layers and the screen printing lightproof layer are obtained through edging treatment of the substrate or through carbonizing treatment of the high-intensity optical energy and the reflecting light is reduced, can be combined by two or more and used in one embodiment.

The above contents are further detailed descriptions of the present application in combination with specific preferred embodiments. However, the specific implementation of the present application shall not be considered to be only limited to these descriptions. For those of ordinary skill in the art to which the present application belongs, several simple deductions or replacements may be made without departing from the conception of the present application, all of which shall be considered to belong to the protection scope of the present application.

The invention claimed is:

1. A display apparatus comprises:
   a display panel, comprising a first substrate, a second substrate and sealing portions, wherein the first substrate and the second substrate are arranged opposite to each other, the sealing portions are arranged between the first substrate and the second substrate, and the sealing portions are arranged to surround an active area of the display panel; and
   polarizers, comprising a first polarizer and a second polarizer; wherein an outer side of the first substrate comprises bonding portions covering the sealing portions in corresponding positions, and a polarizing portion in a middle position between the bonding portions;
   wherein the first polarizer and the second polarizer are arranged successively on the bonding portions, or the second polarizer and the first polarizer are arranged successively on the bonding portions; and
   a layer of the first polarizer and a layer of the second polarizer are arranged successively on the bonding portions, and the first polarizer is arranged on one side close to the first substrate; a layer of the first polarizer is arranged on the polarizing portion;
   wherein a thickness of the first polarizer is equal to a thickness of the second polarizer;
   wherein the display panel comprises an array substrate and a color filter substrate; the first polarizer is a polarizer used on an array substrate side; the second polarizer is a polarizer used on a color filter substrate side;
   wherein a width of the first substrate is greater than a width of the second substrate;
   wherein the second polarizer is arranged on an outer side of the second substrate;
   wherein a width of the polarizer arranged on the outer side of the first substrate is equal to the width of the first substrate; and a width of the polarizer arranged on the outer side of the second substrate is equal to the width of the second substrate;
   wherein a functional layer of the active area is arranged between the two sealing portions; and widths of the two sealing portions and the functional layer are less than the width of the second substrate; and
   the functional layer comprises an array layer, a first alignment layer, a liquid crystal layer, a second alignment layer and a color filter layer successively from top to bottom;
   wherein the array layer comprises an active switch, wherein the active switches are thin film transistors.

2. A display apparatus comprises:
   a display panel, comprising a first substrate, a second substrate and sealing portions, wherein the first substrate and the second substrate are arranged opposite to each other, the sealing portions are arranged between the first substrate and the second substrate, and the sealing portions are arranged to surround an active area of the display panel; and polarizers, comprising a first polarizer and a second polarizer, wherein the outer side of the first substrate comprises bonding portions covering the sealing portions in corresponding positions, and a polarizing portion in a middle position between the bonding portions;

wherein the first polarizer and the second polarizer are arranged successively on the bonding portions, or the second polarizer and the first polarizer are successively on the bonding portions, a layer of the second polarizer and a layer of the first polarizer are arranged successively on the bonding portions, and the second polarizer is arranged on one side close to the first substrate; and a layer of the first polarizer is arranged on the polarizing portion; a layer of the first polarizer is arranged on both ends of the first polarizer;

wherein the thickness of the first polarizer is equal to the thickness of the second polarizer;

wherein the display panel comprises an array substrate and a color filter substrate; the first polarizer is a polarizer used on an array substrate side; the second polarizer is a polarizer used on a color filler substrate side;

wherein the width of the first substrate is greater than the width of the second substrate;

wherein the second polarizer is arranged on an outer side of the second substrate;

wherein the width of the polarizer arranged on the outer side of the first substrate is equal to the width of the first substrate; and the width of the polarizer arranged on the outer side of the second substrate is equal to the width of the second substrate;

wherein the functional layer of the active area is arranged between the two sealing portions; and the widths of the two sealing portions and the functional layer are less than the width of the second substrate; and the functional layer comprises an array layer, a first alignment layer, a liquid crystal layer, a second alignment layer and a color filter layer successively from top to bottom;

wherein the array layer comprising an active switch, and the active switches are thin film transistors.

3. A display apparatus comprises:

a display panel, comprising a first substrate, a second substrate and sealing portions, wherein the first substrate and the second substrate are arranged opposite to each other, the sealing portions are arranged between the first substrate and the second substrate, and the sealing portions are arranged to surround an active area of the display panel; and polarizers, comprising a first polarizer and a second polarizer, wherein an outer side of the first substrate comprises bonding portions covering the sealing portions in corresponding positions, and a polarizing portion in a middle position between the bonding portions;

wherein the first polarizer and the second polarizer are arranged successively on the bonding portions, or the second polarizer and the first polarizer are successively on the bonding portions.

4. The display apparatus according to claim 3, wherein a layer of the first polarizer and a layer of the second polarizer are arranged successively on the bonding portions; the first polarizer is arranged on one side close to the first substrate; and a layer of the first polarizer is arranged on the polarizing portion.

5. The display apparatus according to claim 4, wherein the thickness of the first polarizer is equal to the thickness of the second polarizer.

6. The display apparatus according to claim 3, wherein a layer of the second polarizer and a layer of the first polarizer are arranged successively on the bonding portions; the second polarizer is arranged on one side close to the first substrate; and a layer of the first polarizer is arranged on the polarizing portion.

7. The display apparatus according to claim 6, wherein a layer of the first polarizer is arranged on the polarizing portion, and a layer of the first polarizer is arranged on both ends of the first polarizer.

8. The display apparatus according to claim 7, wherein the thickness of the first polarizer is equal to the thickness of the second polarizer.

9. The display apparatus according to claim 6, wherein the thickness of the first polarizer is equal to the thickness of the second polarizer.

10. The display apparatus according to claim 3, wherein a layer of the second polarizer and a layer of the first polarizer are arranged successively on the bonding portions; the second polarizer is arranged on one side close to the first substrate; and a layer of the first polarizer is arranged on the polarizing portion, and a layer of the first polarizer is arranged on both ends of the first polarizer.

11. The display apparatus according to claim 3, wherein a layer of the first polarizer and a layer of the second polarizer are arranged successively on the bonding portions; the first polarizer is arranged on one side close to the first substrate; and a layer of the first polarizer is arranged on the polarizing portion, and the thickness of the first polarizer is equal to the thickness of the second polarizer.

12. The display apparatus according to claim 3, wherein a layer of the second polarizer and a layer of the first polarizer are arranged successively on the bonding portions; the second polarizer is arranged on one side close to the first substrate; and a layer of the first polarizer is arranged on the polarizing portion, the thickness of the first polarizer is equal to the thickness of the second polarizer.

13. The display apparatus according to claim 3, wherein a layer of the second polarizer and a layer of the first polarizer are arranged successively on the bonding portions; the second polarizer is arranged on one side close to the first substrate; and a layer of the first polarizer is arranged on the polarizing portion, a layer of the first polarizer is arranged on both ends of the first polarizer, and the thickness of the first polarizer is equal to the thickness of the second polarizer.

14. The display apparatus according to claim 3, wherein the display panel comprises an array substrate and a color filter substrate; the first polarizer is a polarizer used on an array substrate side; and the second polarizer is a polarizer used on a color filter substrate side.

15. The display apparatus according to claim 3, wherein a layer of the first polarizer and a layer of the second polarizer are arranged successively on the bonding portions; the first polarizer is arranged on one side close to the first substrate; a layer of the first polarizer is arranged on the polarizing portion, and the thickness of the first polarizer is equal to the thickness of the second polarizer, the display panel comprises an array substrate and a color filter substrate, the first polarizer is a polarizer used on an allay substrate side, and the second polarizer is a polarizer used on a color filter substrate side.

16. The display apparatus according to claim 3, wherein a layer of the second polarizer and a layer of the first polarizer are arranged successively on the bonding portions; the second polarizer is arranged on one side close to the first substrate; a layer of the first polarizer is arranged on the polarizing portion; a layer of the first polarizer is arranged on both ends of the first polarizer; and the thickness of the first polarizer is equal to the thickness of the second polarizer; the display panel comprises an array substrate and a color filter substrate; the first polarizer is a polarizer used on an array substrate side; and the second polarizer is a polarizer used on a color filter substrate side.

17. The display apparatus according to claim 3, wherein the width of the first substrate is greater than the width of the second substrate; the second polarizer is arranged on an outer side of the second substrate; the width of the polarizer arranged on the outer side of the first substrate is equal to the width of the first substrate; and the width of the polarizer arranged on the outer side of the second substrate is equal to the width of the second substrate.

18. The display apparatus according to claim 17, wherein the functional layer of the active area is arranged between the two sealing portions, and the widths of the two sealing portions and the functional layer are less than the width of the second substrate.

19. The display apparatus according to claim 3, wherein the functional layer comprises an array layer, a first alignment layer, a liquid crystal layer, a second alignment layer and a color filter layer successively from top to bottom.

20. The display apparatus according to claim 19, wherein the array layer comprises an active switch, and the active switches are thin film transistors.

* * * * *